US009844156B2

(12) United States Patent
Howard et al.

(10) Patent No.: US 9,844,156 B2
(45) Date of Patent: Dec. 12, 2017

(54) LED RETAIL DIGITAL SIGNAGE

(71) Applicant: CLOVERLEAF MEDIA LLC, San Diego, CA (US)

(72) Inventors: Kevin Brent Howard, Laguna Niguel, CA (US); Gordon Davidson, Irvine, CA (US)

(73) Assignee: Cloverleaf Media, LLC

( * ) Notice: Subject to any disclaimer, the term of this patent is extended or adjusted under 35 U.S.C. 154(b) by 0 days.

(21) Appl. No.: 15/140,374

(22) Filed: Apr. 27, 2016

(65) Prior Publication Data

US 2017/0105300 A1    Apr. 13, 2017

Related U.S. Application Data

(60) Provisional application No. 62/240,455, filed on Oct. 12, 2015.

(51) Int. Cl.
| | |
|---|---|
| *G09F 3/20* | (2006.01) |
| *H05K 5/02* | (2006.01) |
| *G06F 3/14* | (2006.01) |
| *G09G 3/32* | (2016.01) |
| *H05K 5/00* | (2006.01) |
| *H04N 5/225* | (2006.01) |

(52) U.S. Cl.
CPC ......... *H05K 5/0217* (2013.01); *G06F 3/1446* (2013.01); *G09F 3/204* (2013.01); *G09G 3/32* (2013.01); *H05K 5/0017* (2013.01); *H05K 5/0247* (2013.01); *G09G 2380/04* (2013.01); *H04N 5/2257* (2013.01)

(58) Field of Classification Search
CPC .......... G09F 3/204; G09F 1/103; G09F 3/208
See application file for complete search history.

(56) References Cited

U.S. PATENT DOCUMENTS

| | | | |
|---|---|---|---|
| 2002/0167500 A1 | 11/2002 | Gelbman | |
| 2004/0178308 A1* | 9/2004 | Bacnik | G09F 3/204 248/223.41 |
| 2005/0103853 A1 | 5/2005 | Stephenson et al. | |
| 2005/0104806 A1 | 5/2005 | Stephenson | |
| 2005/0134549 A1 | 6/2005 | Kamiya et al. | |
| 2005/0218218 A1* | 10/2005 | Koster | G06F 3/147 235/383 |

(Continued)

FOREIGN PATENT DOCUMENTS

WO    WO 2016/019352    2/2016

OTHER PUBLICATIONS

International Search Report and Written Opinion for International Application No. PCT/US2015/043316, dated Jan. 22, 2016, 14 pages.

(Continued)

*Primary Examiner* — Dorothy Harris
(74) *Attorney, Agent, or Firm* — Cooley LLP (57) ABSTRACT

A display unit capable of being used within retail environments. The display unit may include a screen body having a first surface and a second surface, the first surface displaying an array of viewable pixels. The display unit may further include a camera and a housing body. The display unit may be configured to be joined with additional display units, such as like display units. Display units joined together may form a continuous display configuration and have a high aspect ratio.

24 Claims, 6 Drawing Sheets

(56) References Cited

U.S. PATENT DOCUMENTS

| | | |
|---|---|---|
| 2006/0232495 A1 | 10/2006 | Chang et al. |
| 2006/0273162 A1* | 12/2006 | Andersson .............. G06F 3/147 235/383 |
| 2007/0109262 A1 | 5/2007 | Oshima et al. |
| 2010/0012600 A1 | 1/2010 | Clontz et al. |
| 2010/0287057 A1 | 11/2010 | Aihara et al. |
| 2011/0006114 A1 | 1/2011 | Schueller et al. |
| 2011/0173082 A1 | 7/2011 | Breitenbach et al. |
| 2011/0181495 A1* | 7/2011 | Chu .......................... G09F 9/33 345/1.3 |
| 2011/0231285 A1 | 9/2011 | Englund et al. |
| 2011/0286195 A1* | 11/2011 | Horikiri ................ G09F 3/204 361/807 |
| 2012/0023797 A1* | 2/2012 | Rosander ............... G09F 3/204 40/655 |
| 2012/0120327 A1* | 5/2012 | Marx ...................... G06F 3/147 348/840 |
| 2012/0120471 A1* | 5/2012 | Hamalainen .......... G09F 3/0297 359/238 |
| 2012/0223875 A1 | 9/2012 | Lau et al. |
| 2012/0261711 A1 | 10/2012 | Brown et al. |
| 2013/0117153 A1* | 5/2013 | Shen ................. G06Q 30/0241 705/26.9 |
| 2013/0186962 A1 | 7/2013 | Kennett et al. |
| 2013/0226742 A1 | 8/2013 | Johnson et al. |
| 2013/0241431 A1 | 9/2013 | Toyotaka et al. |
| 2013/0335353 A1 | 12/2013 | Segal et al. |
| 2014/0139548 A1* | 5/2014 | Byers .................... G06F 3/1431 345/619 |
| 2015/0039477 A1 | 2/2015 | O'Neil |
| 2015/0042540 A1* | 2/2015 | Goel .................... G06Q 20/201 345/1.3 |
| 2015/0140668 A1 | 5/2015 | Mellars et al. |
| 2015/0186097 A1* | 7/2015 | Hall ...................... G06F 3/1446 345/1.3 |
| 2015/0262230 A1 | 9/2015 | Cypher et al. |
| 2016/0034244 A1 | 2/2016 | Howard et al. |
| 2016/0034959 A1 | 2/2016 | Howard et al. |
| 2016/0034960 A1 | 2/2016 | Howard et al. |
| 2016/0034988 A1 | 2/2016 | Howard et al. |
| 2016/0065649 A1 | 3/2016 | Ou |
| 2016/0078796 A1* | 3/2016 | Cho ..................... G09G 3/2003 345/690 |
| 2016/0132822 A1 | 5/2016 | Swafford |
| 2016/0240131 A1 | 8/2016 | Howard et al. |
| 2016/0260163 A1* | 9/2016 | Sjodin ............... G02F 1/133382 |

OTHER PUBLICATIONS

Office Action for U.S. Appl. No. 15/140,416, dated Aug. 18, 2016, 23 pages.

Office Action for U.S. Appl. No. 14/815,784, dated Nov. 3, 2016, 34 pages.

Office Action for U.S. Appl. No. 15/139,082, dated Aug. 31, 2016, 34 pages.

Office Action for U.S. Appl. No. 15/139,082, dated Dec. 23, 2016, 33 pages.

International Search Report and Written Opinion for International Application No. PCT/US2016/056461, dated Dec. 2, 2016, 17 pages.

International Search Report and Written Opinion for International Application No. PCT/US2016/056455, dated Dec. 9, 2016, 17 pages.

* cited by examiner

LED RETAIL DIGITAL SIGNAGE

CROSS REFERENCE TO RELATED APPLICATIONS

This application claims the benefit of U.S. Provisional Application Nos. 62/240,455, entitled LED RETAIL DIGITAL SIGNAGE, filed Oct. 12, 2015. The present application is also related to U.S. application Ser. No. 15/140,416, entitled SYSTEMS AND METHODS FOR SERVING PIXEL MAPPED CONTENT TO MERCHANDISING COMMUNICATION SYSTEMS, filed Apr. 27, 2016, U.S. application Ser. No. 14/815,784, entitled DYNAMIC MERCHANDISING COMMUNICATION SYSTEM, filed Jul. 31, 2015, U.S. patent application Ser. No. 14/815,760, entitled MERCHANDISING COMMUNICATION AND INVENTORYING SYSTEM, filed Jul. 31, 2015, U.S. patent application Ser. No. 14/815,745, entitled SYSTEM AND METHODS FOR SERVING CONTENT TO MERCHANDISING COMMUNICATION SYSTEMS, filed Jul. 31, 2015, and to U.S. patent application Ser. No. 14/815,723, entitled SYSTEMS AND METHODS FOR SERVING CONTENT TO MERCHANDISING COMMUNICATION SYSTEMS BASED ON EXTERNAL EVENTS, filed Jul. 31, 2015, each of which are incorporated herein by reference in their entireties.

FIELD

The disclosure relates to display devices and systems configured, for example, to be used in retail environments.

BACKGROUND

There are a variety of retail options for displaying a variety of information in retail environments, including, pricing, labeling, promotions, etc. Traditionally, this information has been provided using print systems, including slide-in paper system, plastic label systems, adhesive label systems, etc. More recently, there has been increased interest in utilizing digital or electronic merchandising communication systems to display such information.

SUMMARY

Provided herein are descriptions of novel forms of digital signage which may be useful in, for example, retail environments. In specific embodiments, such digital signage is useful and/or used in combination with retail shelving or other retail platforms. In specific embodiments, digital signage provided herein comprises one or more display unit, such as a retail display unit when utilized in retail environments.

In some instances, disclosed herein is a display unit (e.g., a light emitting diode (LED) retail display unit) comprising a screen body comprising a first surface and a second surface, the first surface displaying an array of viewable LED pixels. In certain embodiments, the display unit comprises a first camera comprising a first camera lens and a first camera body. In further embodiments, the display unit comprises a second camera comprising a second camera lens and a second camera body. In some embodiments, the display unit comprises a housing body including a rear housing surface, a first lateral housing end, a second lateral housing end, an upper housing end, and a lower housing end, the first housing body defining at least one front housing opening, and a first rear housing opening. In specific embodiments, the housing body receives the screen body and is affixed to the second surface of the screen body, the array of viewable LED pixels being exposed external to the housing body by the at least one front housing opening. In some embodiments, the housing body receives the first camera body, the first camera lens being exposed externally to the housing body by the at least one front housing opening (or at least one rear housing opening). In certain embodiments, the housing body receives the second camera body, the second camera lens being exposed externally to the housing body by the first rear housing opening (e.g., and the first camera lens is exposed externally via at least one front housing opening). In some embodiments, the housing body comprises at least one guide post extending from the first lateral housing end and at least one guide post receiver orifice extending into the second lateral housing end.

Also disclosed herein is a retail merchandising display system comprising a first display unit and a second display unit. In specific embodiments, a guide post of the first display unit is coupled with (e.g., extends into) the guide post receiver of the second display unit.

These and other objects, features, and characteristics of the system and/or method disclosed herein, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of "a", "an", and "the" include plural referents unless the context clearly dictates otherwise.

DETAILED DESCRIPTION OF EMBODIMENTS

In some embodiments, disclosed herein is a display unit capable of being used within, for example, retail environments. In certain embodiments, each display unit is a high aspect ratio display unit (e.g., having an aspect ratio (length/height) of about 1.5 or more). In specific embodiments, a display unit provided herein is configured to be joined with additional display units, such as like display units. In some embodiments, provided herein is a system comprising multiple display units provided herein, joined together to form a continuous display configuration (e.g., combining to have an aspect ratio of about 3 or more, about 5 or more, about 10 or more, about 20 or more, about 50 or more, about 100 or more, or the like).

In certain embodiments, the display unit is a light emitting diode (LED) display unit (e.g., comprising a viewable LED pixel array). In various embodiments, such display units and multi-unit systems provided herein are used in any suitable environment. In preferred embodiments, the display units and/or multi-unit systems are used in a retail environment, e.g., as digital signage on shelving fronts, such as replacing traditional printed signage. In some instances, such configurations allow for decreased labor costs in installing new signage every time a product and/or price is changed, opportunities for ad based revenues, an improved customer experience, and many other advantages.

Figure 1:
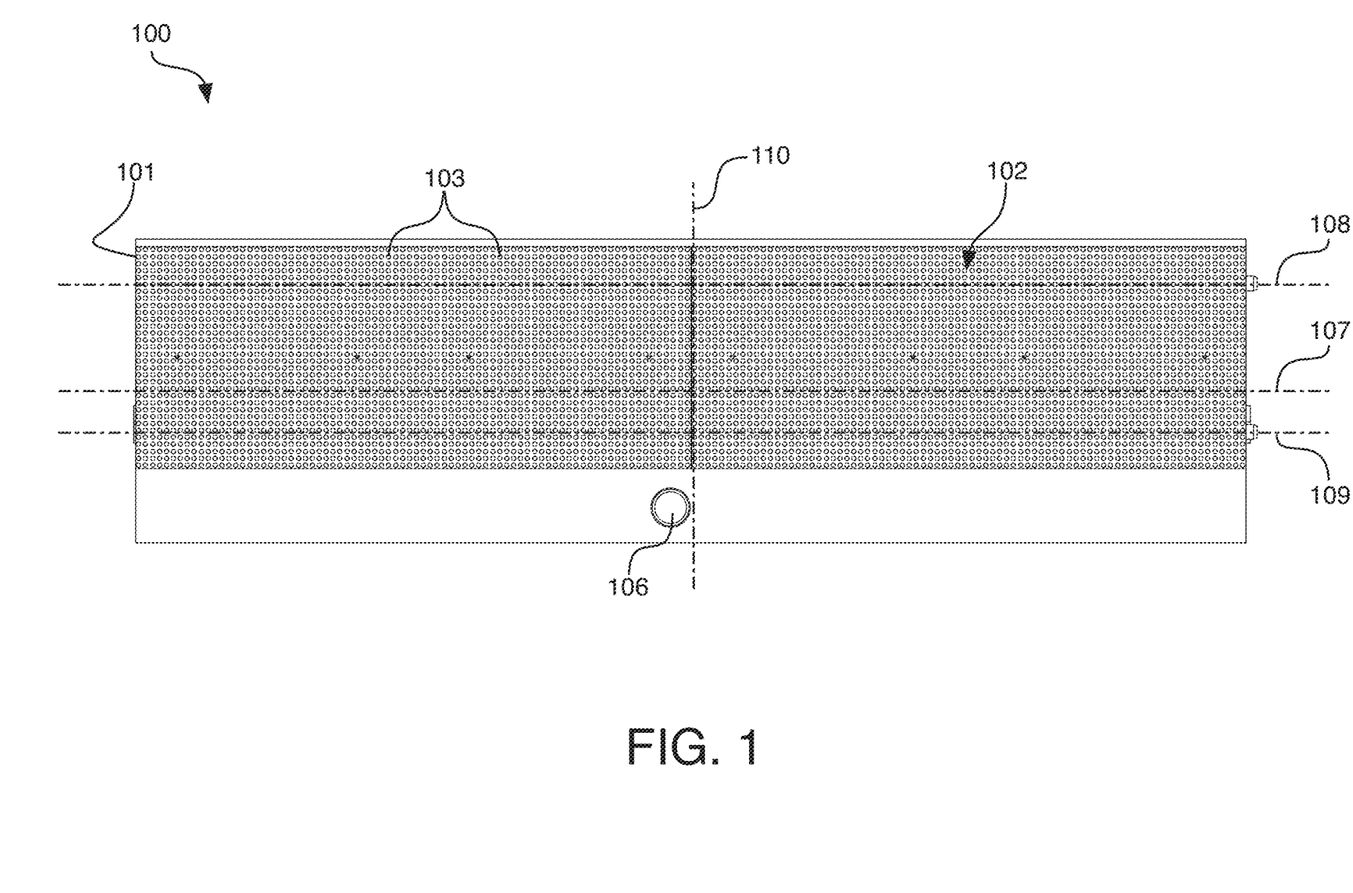
FIG. 1 illustrates a front view of an exemplary display unit 100 provided herein.

FIG. 1 illustrates a front view of an exemplary display unit 100 provided herein. In certain embodiments, a display unit 100 provided herein comprises at least one screen body 101 comprising a front surface 102, displaying an array of viewable (e.g., LED) pixels 103. In some embodiments, a display unit 100 provided herein further comprises a camera, the camera comprising a camera lens 106, e.g., exposed to the front of the display unit 100. In some embodiments, the camera lens 106 is optionally omitted and optionally replaced with a cap.

Any suitable configuration of the display unit is utilized. In some embodiments, the display units are used in a retail setting, wherein high aspect ratio units are desirable. In some embodiments, the display unit has an aspect ratio of about 2 or more, or about 3 or more. As noted above, very high aspect ratio systems may be configured using multiple display units described herein. In some embodiments, the length of the display unit is at least 20 cm (e.g., at least 25 cm, about 25 cm to about 100 cm, about 30 cm to about 60 cm, or the like). In certain embodiments, the height of the display unit is about 25 cm or less (e.g., about 20 cm or less, about 15 cm or less, about 3 cm to about 25 cm, about 5 cm to about 15 cm, about 5 cm to about 10.5 cm, about 6 cm to about 7 cm, or the like). In certain embodiments, such as are used in retail environments, very thin display units are desired. Thin display units minimize protrusion into a retail aisle, e.g., thereby minimizing interaction with persons (e.g., customers in the aisle), which may minimize damaging and/or disconnecting of the display units. In certain embodiments, flat panel display units provided herein have a depth of about 5 cm or less, about 4 cm or less, about 3 cm or less, about 2.5 cm or less, about 2 cm or less, or the like. More specific details of certain display unit configurations are set forth in the above-referenced co-pending application Ser. No. 14/815,784, entitled DYNAMIC MERCHANDISING COMMUNICATION SYSTEM, filed Jul. 31, 2015, which is incorporated herein by reference in its entirety.

In specific embodiments, provided herein are LED display units comprising an array of viewable LED pixels. In specific embodiments, the LED pixel comprises a red light emitting diode, a green light emitting diode, or a blue light emitting diode. In more specific embodiments, the LED pixel comprises a red light emitting diode, a green light emitting diode, and a blue light emitting diode. In certain embodiments, the light emitting diode is a light emitting diode chip. In specific embodiments, the LED display component comprises a conductive substrate (e.g., a printed circuit board (PCB) (e.g., a metal core printed circuit board (MCPCB))) comprising multiple light emitting diode chips mounted on or embedded in a substrate (e.g., using chip on board technologies). The chip is optionally mounted to the substrate using any suitable technique, such as by affixing the chip with an electrically conductive adhesive (e.g., an epoxy, an acrylic, a cyanoacrylate, a silicone, a urethane acrylate, or the like comprising a conductive filler, such as silver, nickel, carbon, or the like) or using any other suitable technique, such as soldering. In some embodiments, it is possible to reduce the pixel pitch (i.e., the distance between the center of one pixel to the center of adjacent pixel(s)). In some embodiments, any suitable LED technology is optionally utilized, e.g., multiple cups chip on board (MCOB), chip on board (COB) LED, surface mounted device (SMD) LED, wired LED, or the like. In preferred embodiments, the pixel pitch of any LED display or display unit provided herein is about 3.0 mm or less. In more preferred embodiments, the pixel pitch is about 2.5 mm or less. In still more preferred embodiments, the pixel pitch is about 2.0 mm or less. In yet more preferred embodiments, the pixel pitch is about 1.9 mm or less (e.g., about 1.875 mm). In some embodiments, the circuit board comprising the LED array further comprises one or more (e.g., multiple) LED drivers.

In certain embodiments, the array of viewable LED pixels has a first number of pixels in a first (e.g., heightwise) dimension and a second number of pixels in a second (e.g., lengthwise) dimension. In some embodiments, the first (height) dimension comprises about 24 pixels or more. In preferred embodiments, the first (height) dimension comprises about 30 pixels or more (e.g., about 32 pixels). In more preferred embodiments, the first (height dimension comprises about 30 to about 60 pixels. Generally, about 30 or more pixels are preferred to provide minimum desired display requirements, providing for at least three lines of text with minimal visible text defect. Any suitable number of pixels is present in the second (length) direction. Pixel pitch in the second (length) dimension is preferably about the same as the pixel pitch in the first (height) dimension, the number of pixels being determined thereby and by the length of the display unit. In certain embodiments, the number of LED pixels in the second dimension is about 100 or more. In preferred embodiments, the number of LED pixels in the second dimension is about 100 to about 500, e.g., about 120 to about 200 or about 160.

Figure 2:
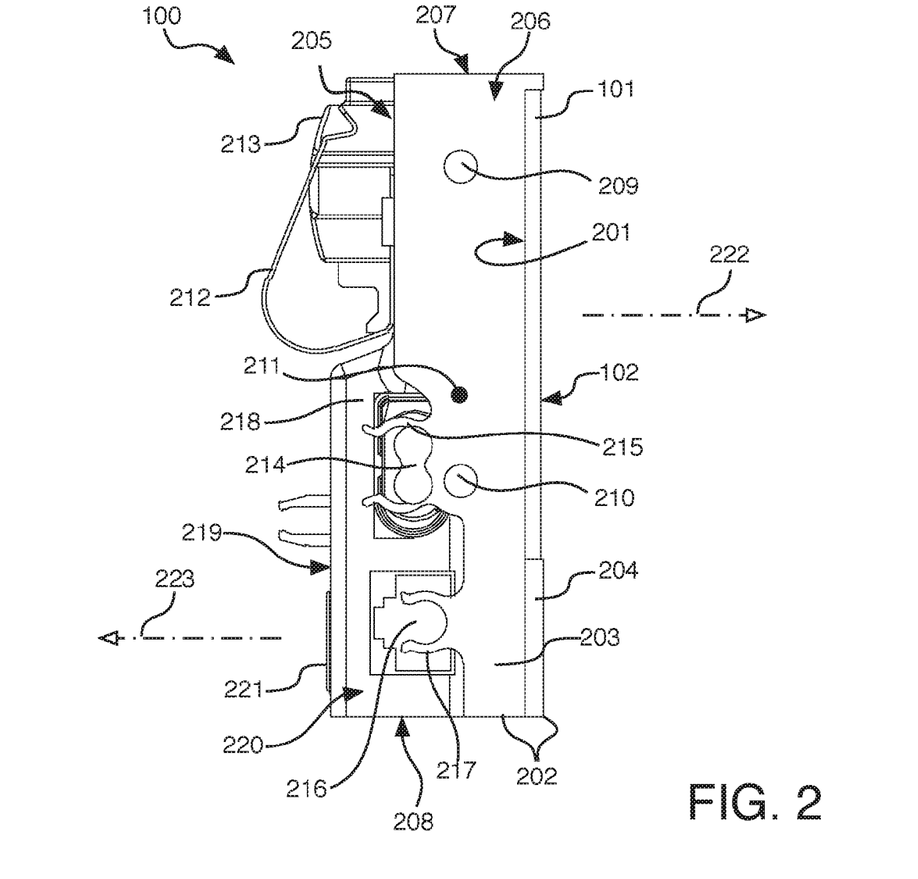
FIG. 2 illustrates a (left) side view of an exemplary display unit provided herein.

FIG. 2 illustrates a (left) side view of an exemplary display unit 100 provided herein. In some embodiments, the display unit comprises at least one screen body 101, having a front (first) 102 and a back (second) surface 201. In some embodiments, the display unit comprises a housing body, optionally comprising a rear (first) housing body component 203 and a front (second) housing body component 204. In certain embodiments, a display unit provided herein comprises a rear housing surface 205 (which is optionally flat or contoured, e.g., depending on the surface to which the display unit is configured to be attached), a first lateral housing end 206, a second lateral housing end (not shown), an upper housing end 207, and a lower housing end 208.

In certain embodiments, provided herein is a display unit 100 comprising at least one guide post 209, 210 extending from the first 206 or second lateral housing end (not shown). In specific instances, the display unit 100 comprises a guide post 209 extending from the first lateral housing end 206, the guide post being configured between a vertically bisecting longitudinal axis 107, 211 (e.g., located at the midpoint between the upper housing end 207 and the lower housing end 208) and the upper housing end 207. In further or alternative specific embodiments, a display unit 100 provided herein comprises a guide post 210 extending from the first 206 or second lateral housing end (not shown), the second guide post 210 being configured on the vertically bisecting axis 107, 211, or between the vertically bisecting axis 107, 211 and the lower housing end 208. A guide post utilized in display units optionally comprise any suitable configuration, such as being a cylindrical protrusion, a prismatic protrusion, a pyramidal protrusion, a hook-like protrusion, or the like. In certain embodiments, a display unit 100 provided herein further comprises at least one guide post receiver (not shown). In some embodiments, a guide post receiver is configured to receive a guide post described herein. In specific embodiments, the guide post receiver is configured along a longitudinal axis (e.g., 108 and/or 109) of a display unit 100 provided herein with a guide post 209, 210 of the display unit 100. In some instances, alignment of a guide post 209, 210 and a guide post receiver (not shown) allows multiple display units to be joined together (or fastened together, e.g., wherein hook-like guide posts or similar fastening guide post/receiver configurations are utilized), and allows the multiple display units to be configured such that the upper surfaces 207 and lower surfaces 208 thereof are in substantial alignment (e.g., within about 20 mm, or within about 10 mm, or within about 5 mm of adjacent display unit(s)). In certain embodiments, guide posts provided herein extend from a side surface of a display unit provided herein in any suitable length, and guide post receivers extend into a side surface of a display unit provided herein in any suitable length. In some embodiments, guide posts provided herein have a length of about 0.1 mm to about 1 cm, or more. In more specific embodiments, guide posts have a length of about 0.5 mm to about 5 mm. Similarly, guide post thicknesses and/or diameters are of any suitable dimension, e.g., about 0.05 mm to about 5 mm. In some embodiments, guide post receivers extend by any suitable length into the display unit, such as about 0.1 mm to about 1 cm into the display unit (e.g., side surface thereof). In specific embodiments, the depth of a guide post receiver of the display unit is at least as deep as the length of a guide post of the display unit (e.g., having a depth that substantially corresponds to the length of the guide post). In some embodiments, wherein multiple guide posts and/or receivers are utilized the lengths and/or depths thereof are optionally the same or different. In certain embodiments, the guide post is a detachable guide post. For example, in some instances, a guide post is a guide pin structure (e.g., a cylindrical, polygonal, etc. shaped dowel or pin) inserted into a guide post receiver. In other words, in some embodiments, a display provided herein, rather than having a guide post on one side and a guide post receiver on the other side has a guide post receiver on both sides, wherein each receiver is configured to receive a guide pin (e.g., which, when inserted into one end provides a display unit comprising a guide post on one side and a guide post receiver on the other).

Figure 3:
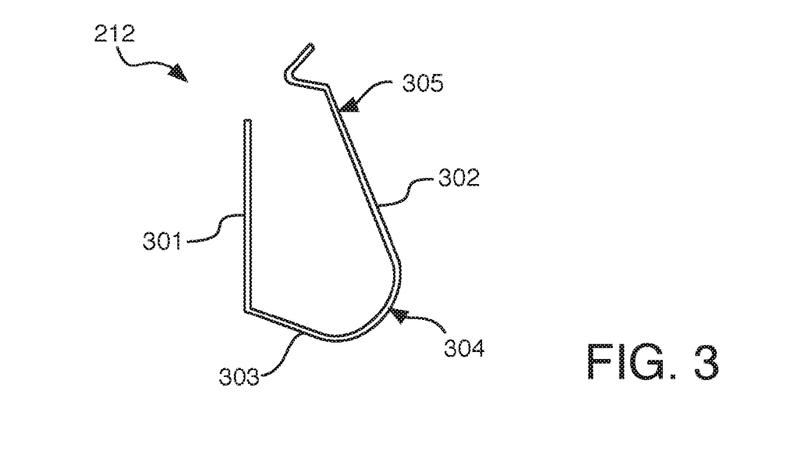
FIG. 3 illustrates a side view of an exemplary mounting fastener provided herein, which may be configured to facilitate attachment of the display unit to a retail shelving unit or other fixed object (such as a vertical surface/plane).

In some embodiments, a display unit comprises a mounting fastener 212, such as illustrated in FIG. 2. In certain embodiments, the mounting fastener 212 is configured to affix a display unit 100 herein to a fixed object (not shown), such as a flat or contoured panel edge, such as a front edge of retail shelving (not shown). In specific embodiments, the mounting fastener 212 is a spring plate fastener, which is configured to circumvent a portion of a fixed object (not shown) and apply pressure thereto (and, thereby apply pressure between the fixed object (not shown) and the display unit 100, such as the rear surface thereof 205, or a mounting anchor thereof 213). In specific embodiments, the mounting fastener, such as illustrated in FIG. 3, comprises a plate configured to have a first side mount surface 301, a second side mount surface 302, and a lower mount surface 303, the first side mount surface 301 being secured to the rear housing surface (not shown), and the distance between the first side mount surface 301 and the second side mount surface 302 being larger proximal to the lower mount surface 303 than distal to the lower mount surface 303. In some instances, proximal to the lower surface 303, the second side surface 302 curves away 304 from the first side surface 301, and distal to the lower surface 303, the second side surface curves or jogs toward 305 the first side surface 301. In specific embodiments, the mounting fastener is configured in any suitable position, such as between the vertically bisecting longitudinal axis 107, 211 and the upper housing end 207. Further, in some embodiments, such as wherein multiple (e.g., two) mounting fasteners are utilized, a first fastener is optionally configured between a horizontally bisecting long transversal axis 110 and the first lateral housing end 206, with, e.g., a second fastener (not shown) configured between the horizontally bisecting long transversal axis 110 and the second lateral housing end (not shown). In some embodiments, such configurations provide improved positional stability of the unit.

Generally, the display unit 100 comprises one or more connectors (e.g., a receiver or input configured to receive power and/or data), configured to provide data to and/or from the display unit, power to and/or from the display unit, and the like. In some instances, the housing 202 is configured such that the connectors are internally and/or externally accessible. In specific embodiments, the housing 202 is configured such that one or more connectors is externally accessible by one or more housing opening (e.g., referred to herein as an opening or connector opening defined by the housing).

In some embodiments, the display unit 100 comprises a power connector 214 (e.g., configured to provide power to the display unit 100). In specific embodiments, the display unit further comprises a second power connector (not shown), e.g., configured to be connected to and provide power to an additional/adjacent display unit (not shown). In specific embodiments, the power connector(s) is configured to be accessible external to the display unit. In certain embodiments, the power connectors are configured to receive direct current (e.g., configured to have a positive and a negative connector that are distinctly shaped, such as illustrated in for the power cable(s) in FIG. 4). In some embodiments, the display unit 100 further comprises a power cord guide 215, e.g., configured to minimize wire mess (e.g., which, in a retail setting, minimizes customers or retail products being caught on the wires, which may result in the display unit(s) becoming disconnected and/or damaged), ensure proper connection between a power cord outlet (not shown) and the power cord connector 214, and/or the like.

In some embodiments, the display unit 100 comprises a data connector 216 (e.g., configured to provide data (e.g., display data comprising content to be displayed on the display unit 100) to the display unit 100). In specific embodiments, the display unit further comprises a second data connector (not shown), e.g., configured to be connected to and provide data to an additional/adjacent display unit (not shown). In specific embodiments, the data connector(s) is configured to be accessible external to the display unit. In some embodiments, the display unit 100 further comprises a data cord guide 215, e.g., configured to minimize wire mess, ensure proper connection between a data cord outlet (not shown) and the data cord connector 214, and/or the like.

Exemplary data connectors and cords include, by way of non-limiting example, any suitable wired information connector configured or capable of being configured to transfer data, such as a USB connector (e.g., USB 1.0, USB 2.0, USB 3.0), a modular connector (e.g., 4 position 4 contact (4P4C), 6P6C, 6P2C, 6P4C, 6P6C, 8P8C, 10P10C, or similar modular connector)), an Ethernet connector, a cat5 connector, a cat5e connector, a cat6 connector, a micro USB connector, a mini USB connector, a registered jack (e.g., rj11) connector, a component connector, a RCA connector, a coaxial connector, a digital visual interface (DVI) connector, a video graphics array (VGA) connector, and/or the like.

Further, in some embodiments, the rear surface 205 of the display unit comprises a raised rear housing component 218 of the rear surface 205 of the housing body 202. In specific embodiments, the raised rear housing component 218 comprising a raised component rear surface 219, a first raised component lateral end surface 220, and a second raised component lateral end surface (not shown). In specific embodiments, the power connector 214 is configured such that it is externally accessible by a rear housing opening defined by the first raised component lateral end surface 220 of the raised rear housing component 218. Similarly, in some embodiments, the data connector 216 is configured such that it is externally accessible by a rear housing opening defined by the first raised component lateral end surface 220 of the raised rear housing component 218. In some instances, this configuration allows adjacent display units to have power connectivity using reduced/minimal wire lengths, having reduced/minimal wire mess, reducing/minimizing wiring interfering with attachment of the display unit to a fixed object, and/or the like.

As discussed above for FIG. 1, in some embodiments, a display unit 100 provided herein comprises a camera, the camera comprising a camera lens. In certain embodiments, the camera, as illustrated in FIG. 1 is configured in a forward facing direction (e.g., in a direction parallel with, or within 90 degrees, or within 45 degrees, or within 30 degrees, or within 15 degrees, of the direction the display is configured to face). In further or alternative embodiments, the display unit comprises a rear facing camera FIG. 2 illustrates a display unit comprising a rear facing camera 221, the rear facing camera comprising a camera lens configured to face in a direction 223 opposite the direction faced by the display 222 (e.g., facing a direction about 180 degrees (or about 90 to about 180 degrees, or about 135 to about 180 degrees, or about 165 to about 180 degrees) opposite the direction the display or viewable array is facing). In certain embodiments, the housing is configured to define an opening through which the camera lens is exposed externally to the display unit (e.g., whether the camera is rear or forward facing). In some embodiments, the housing comprises a front housing component 204 defining an opening (not shown) through which a forward facing camera lens is externally exposed (e.g., a portion of the camera protruding through the opening, or the lens being exposed through the opening).

Figure 4:
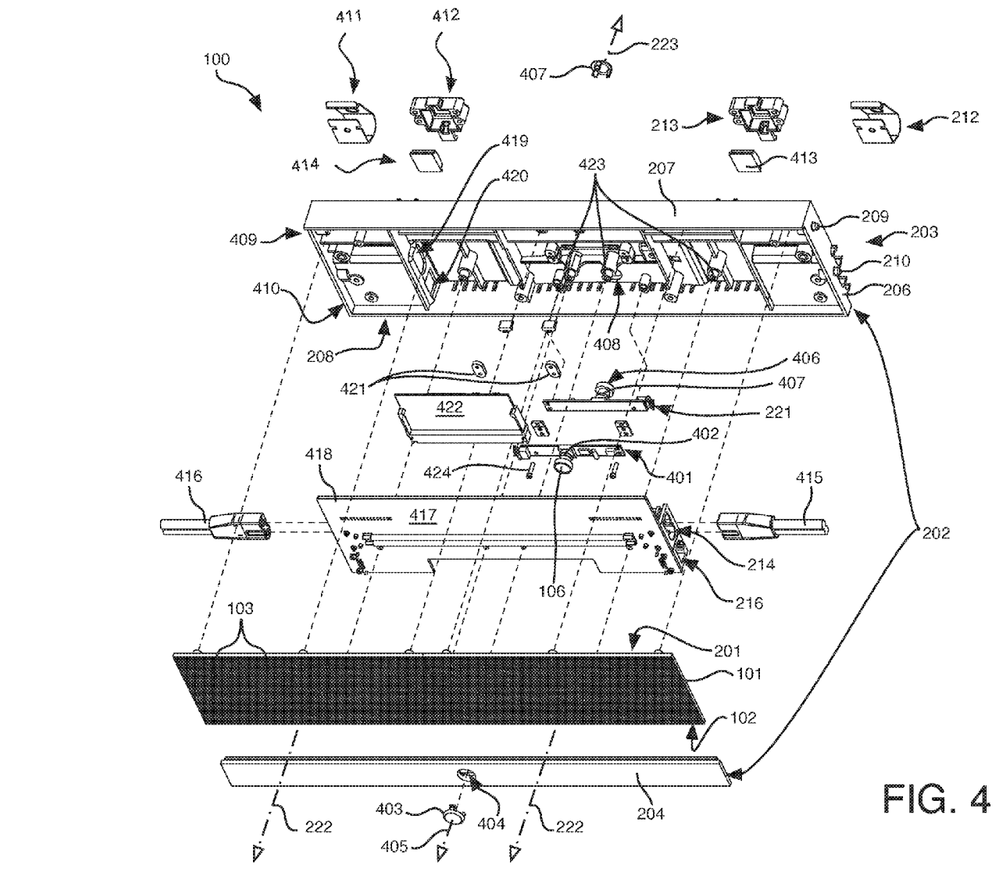
FIG. 4 illustrates an exploded view of an exemplary display unit provided herein.

FIG. 4 illustrates an exploded view of an exemplary display unit 100 provided herein. As illustrated in FIG. 4, the display 100 may comprise one or more display screen body 101. The display screen body 101 may comprise a first surface 102 and a second surface 201. In some embodiments, the display screen body comprises a printed circuit board (PCB). The first surface 102 of the display screen body 101 displaying an array of viewable pixels (e.g., LED pixels) 103. The display unit may comprise a camera 401 (e.g., configured to face in a forward direction), comprising a camera lens 106 and a camera body 402. In some instances, the display unit 100 comprises a cap 403 comprising a transparent component through which the camera lens 106 is exposed externally from the display unit 100. In alternative instances, the forward facing camera is omitted and the cap 403 is used to fill in the opening 404 in the housing (e.g., the forward housing component 204). The display unit may comprise an alternative or additional camera 221 (e.g., configured to face in a rear or backward direction 223). The camera 221 comprises a camera lens 406 and a camera body 407. In some instances, the display unit 100 comprises a cap 407 comprising a transparent component through which the camera lens 406 is exposed externally from the display unit 100. In alternative instances, the rear facing camera is omitted and the cap 406 is (e.g., color matched with the housing 202 and) used to fill in the opening 408 in the housing 202 (e.g., the rear housing component 203). Generally, the camera(s) are received into a housing body 202, the housing body optionally comprising a first component (e.g., rear component) 203 and a second (e.g., forward) component 204. Further, the housing body 202 is generally configured to define the opening(s) 404, 408 through which the camera(s) 221, 401 (or lens(es) thereof 106, 406) is externally exposed.

As further illustrated by FIG. 4, the housing body 202 of a display unit 100 provided herein may comprise a first lateral housing end 206, a second lateral housing end 409, an upper housing end 207, and a lower housing end 208. The housing may comprise a housing body 202 defining at least one front housing opening 404, 410 and/or at least one rear housing opening 408. The housing body 202 may be configured to receive the screen body (or bodies) 102, e.g., the housing body 202 (e.g., the rear housing body component 206) being affixed to the second surface 201 of the screen body 101. The first surface 102 of the screen body 101 (e.g., comprising the array of viewable pixels) may be exposed external to the housing body 202 by at least one front housing opening 410. The screen body 101 and the forward housing body component 204 may be configured to be received by the opening 410 defined by the rear housing body 203, e.g., with the forward housing body component 204 being configured in proximity to the lower housing end 208 and the screen body 101 being configured in proximity to the upper housing end 207. The housing body 202 may be configured to receive a (e.g., forward facing) camera body 402, the first camera lens 106 being exposed externally to the housing body by the at least one front housing opening 404 (e.g., the opening 404 being defined by the housing body 202, such as the forward housing body component thereof 204). The housing body may be configured to receive an alternative or additional (e.g., rear facing) camera body 407, the second camera lens 406 being exposed externally to the housing body 202 by the first rear housing opening 408 (e.g., the opening 408 being defined by the housing body 202, such as the rear housing body component thereof 203).

Additionally, the housing body may comprise at least one guide post 209, 210 extending from a lateral housing end 206, 409. The housing body may also comprise at least one guide post receiver (not shown) extending into a later housing end 206, 409 (e.g., on the opposite lateral housing end of the guide post, such as on the same longitudinal axis as a guide post on the opposite lateral housing end).

FIG. 4 further illustrates that the display unit may comprise at least one mounting fastener (e.g., a first 212 and a second 411 mounting fastener) affixed to the rear surface of the display unit 100. The mounting fastener may be configured to affix the display unit to a fixed object, such as a vertical or substantially vertical plane (the plan may be flat or contoured, but may generally be in a vertical configuration, such as a retail shelf front).

Figure 7:
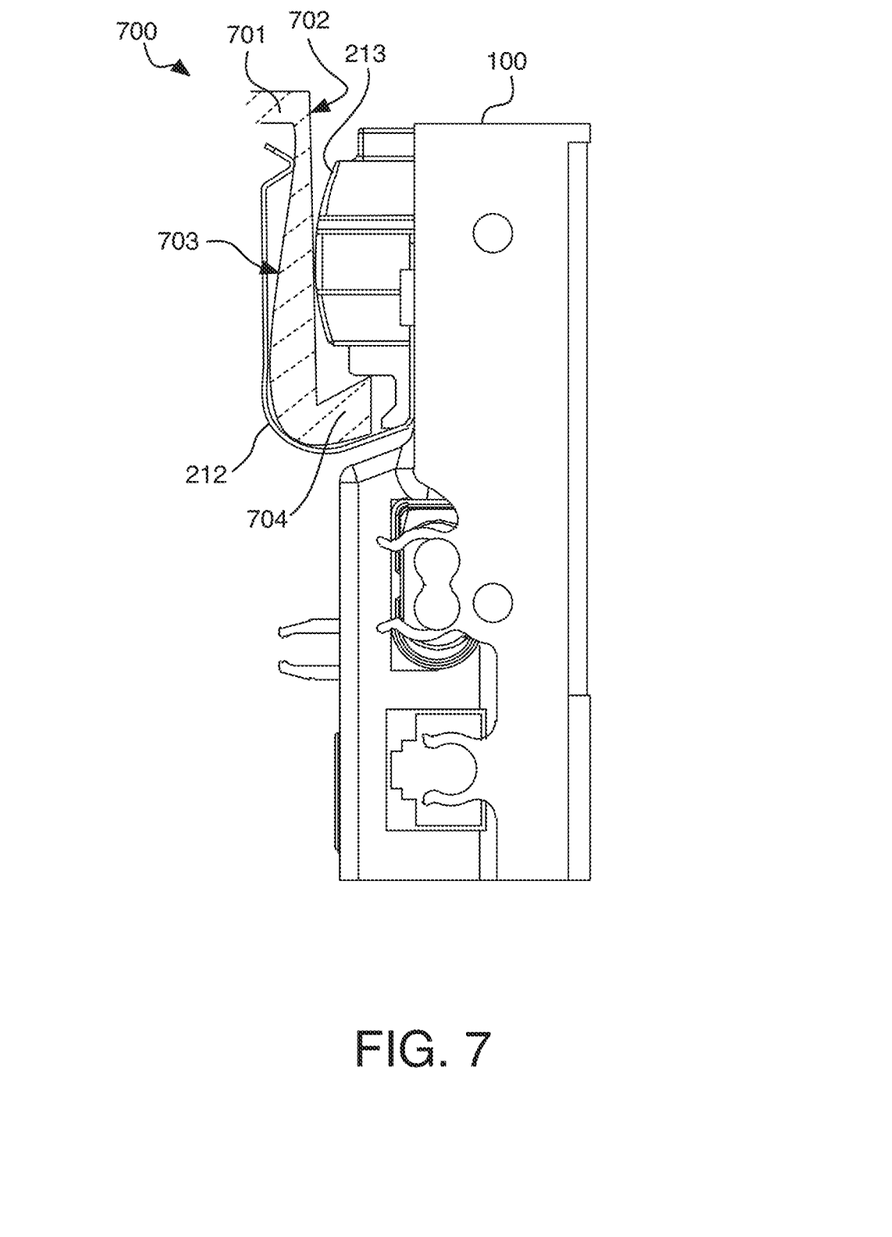
FIG. 7 illustrates an exemplary system (e.g., retail shelving system with digital signage) provided herein wherein an exemplary display unit provided herein is attached to an exemplary fixed object, such as a retail shelf.

FIG. 7 illustrates an exemplary system 700 comprising an exemplary display unit 100 provided herein attached to an exemplary fixed object 701. As illustrated, the fixed object 701 is optionally a retail shelf, such as having a vertical 702 and/or substantially vertical (e.g., contoured) surface 703. In some instances, a vertical surface (or substantially vertical surface) described herein is a flat or contoured surface that is (e.g., endpoint to endpoint for contoured surfaces) configured at an angle of about 45 degrees to about 90 degrees (wherein 90 degrees is strictly vertical). In specific instances, the vertical surface is configured at about 75 degrees to about 90 degrees. In some instances, the retail shelf further comprises a bottom lip 704 that may be accommodated by a mounting fastener 212 and/or display unit 100 configuration provided herein. In some instances, the display unit is configured to be fastened to the fixed object using a mounting fastener 212, e.g., by securing the fixed object 701 (e.g., retail shelf) between a mounting fastener 212 and a mounting anchor 213 (e.g., wherein the mounting anchor is configured to be magnetic, such as by housing or receiving therein a magnet).

In certain embodiments, a display unit 100 provided herein further comprises at least one mounting anchor 213, 412 affixed to the rear surface of the display unit 100. In some instances, the mounting anchors are optionally configured to be magnetic and/or house a magnet 413, 414. In certain instances, such configurations facilitate affixing the display unit 100 to a fixed object, particularly a metallic fixed object (e.g., in combination with or instead of the mounting fastener(s) 213, 411). The mounting anchors are optionally configured in any suitable position. In a specific instance, a display unit comprises a first mounting anchor configured (i) between the vertically bisecting axis of the display unit and the upper housing end, and/or (ii) between a horizontally bisecting long transversal axis and a lateral housing end; and a second mounting anchor configured (i) between the vertically bisecting axis of the display unit and the upper housing end, and/or (ii) between a horizontally bisecting long transversal axis and the opposite (of the first mounting anchor) lateral housing end. In specific embodiments, a mounting anchor is configured between the horizontally bisecting long transversal axis and a mounting fastener.

In some instances, the display unit 100 comprises a power connector 214 configured to receive (or to be connected to receive) a power or a voltage (e.g., direct current) via a power cable 415 or 416 and provide power or voltage to the display unit 100. In some instances, the display unit 100 comprises a second power connector (not shown) to relay or provide power to an adjacent display unit via a second power cable (e.g., the other of 415 or 416). The display unit may comprise at least one data connector 216. In specific embodiments, the display unit comprises a first data connector 216 and a second data connector opposite the first data connector (not shown). In specific embodiments, a display unit 100 provided herein comprises a data connector 216 configured to receive or to be connected to receive display content (e.g., to be displayed on display screen 102), and/or configured to convey or to be connected to convey display content from the display unit 100. In more specific embodiments, the display unit 100 further comprises a second data connector (not shown) configured to receive or to be connected to receive display content (e.g., to be displayed on the display screen), and/or configured to convey or to be connected to convey display content from the display unit 100 (e.g., to an adjacent display unit, such as in a daisy chaining fashion). Generally, the housing 202 is configured to define one or more openings (e.g., on the rear surface thereof) 419, 420 that are configured to allow external (to the display unit) accessibility to the power and/or data connectors 214, 216 provided herein. For example, power cable 416 may gain access to a power connector (not shown) on receiving card 418 via an opening 419 defined by the housing body 202.

In some embodiments, a display unit provided herein comprises a receiving card 417. The receiving card may comprise a circuit board 418, the circuit board 418 comprising one or more data connector(s) 216 and/or one or more power connector(s) 214 associated therewith (e.g., mounted thereon). In specific embodiments, a first data connector of the receiving card is configured to receive or to be connected to receive display information (e.g., to be displayed on the display unit), and, e.g., a second data connector of the receiving card is configured to convey or provide display information to an adjacent display unit (e.g., a different portion of such display information being configured to be display on each display unit). In further or additional embodiments, the receiving card 417 is configured to comprise one or more data output connector(s) mounted thereon (e.g., the number of outputs depending, for example, on the number of display screens 102 configured in the display unit 100) that are not externally accessible. In specific embodiments, such non-externally accessible data output connector(s) are configured to provide or be connected to provide display content to the display screen (e.g., the display screen(s) 102 comprising one or more input connectors configured to receive or be connected to receive) data (e.g., display content) from the receiving card 417.

In addition, the internal structure of the housing body 202 and/or screen body 101 may be configured to secure the components received therein and thereby 101, 417, 401, 221, 422 (e.g., an additional card, such as a sensor card, a hub card, or the like). In some instances, the internal structure of the housing body 202 and/or screen body 101 comprises a number of boss structures 423 to or through which the received components may be fastened (e.g., by one or more fastener 424, such as a screw) and secured. In addition, shims or spacers 421 are optionally included in order to align and secure the components within the housing body 202.

Figure 5:
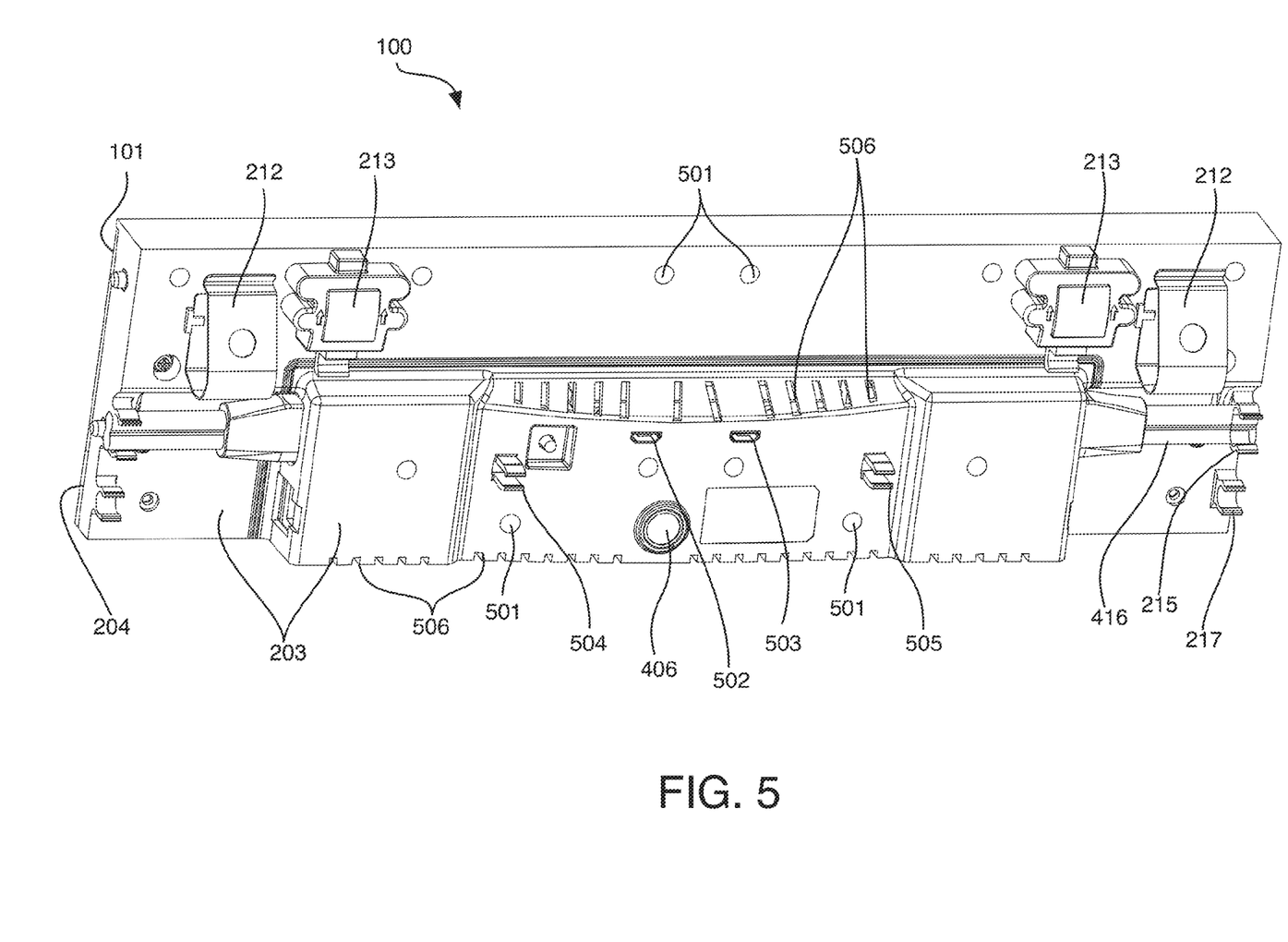
FIG. 5 illustrates a rear view of an exemplary display unit provided herein.

FIG. 5 illustrates a rear view of an exemplary display unit provided herein. As illustrated, in some instances, a rear housing body 203 is fastened to a screen body 101, a front housing body 204, and internal components are optionally fastened with one or more fastener (such as a screw), e.g., via one or more boss and/or one or more counterbore 501 in and/or on the rear surface of rear housing body 203. FIG. 5 further illustrates a rear view of several components discussed as being provided in certain embodiments herein, such as one or more mounting fastener 212, one or more mounting anchors 213 (e.g., magnetic and/or housing a magnet), one or more power cables 415 and/or 416 (e.g., configured to provide and/or be connected to provide power to and/or from the display unit), one or more data connectors 216 (e.g., configured to provide data (e.g., display data comprising content to be displayed on the display unit 100) to and/or from the display unit), a rear facing camera (e.g., the lens thereof 406 being configured to be externally exposed from the display unit, such as through a transparent cap), power cord guide 215, data cable guide 217, and the like. In addition, FIG. 5 illustrates that in some embodiments, one or more additional data connector 502, 503 is optionally present. In some embodiments, the display unit is configured to provide sensor data from and away from the display unit via the one or more additional data connectors 502, 503. In certain embodiments, the display unit further comprises a data cable guide 504, 505 configured to secure a data cable (not shown) connected to and/or configured to be connected to the one or more additional data connectors 502, 503. In specific embodiments, the display unit 101 comprises connector configured to convey or to be connected to convey data from a first camera (e.g., forward facing camera) (e.g., to a controller configured to receive such camera data), and a data connector configured to convey or to be connected to convey data from a second camera (e.g., rear facing camera). Additionally, as illustrated in FIG. 5, a display unit provided herein optionally comprises one or more air vent 506 (e.g., housing body of a display unit herein defines one or more opening configured to facilitate air flow into and out of the interior of the display unit, e.g., to facilitate cooling of the components received within the display unit housing body).

Figure 6:
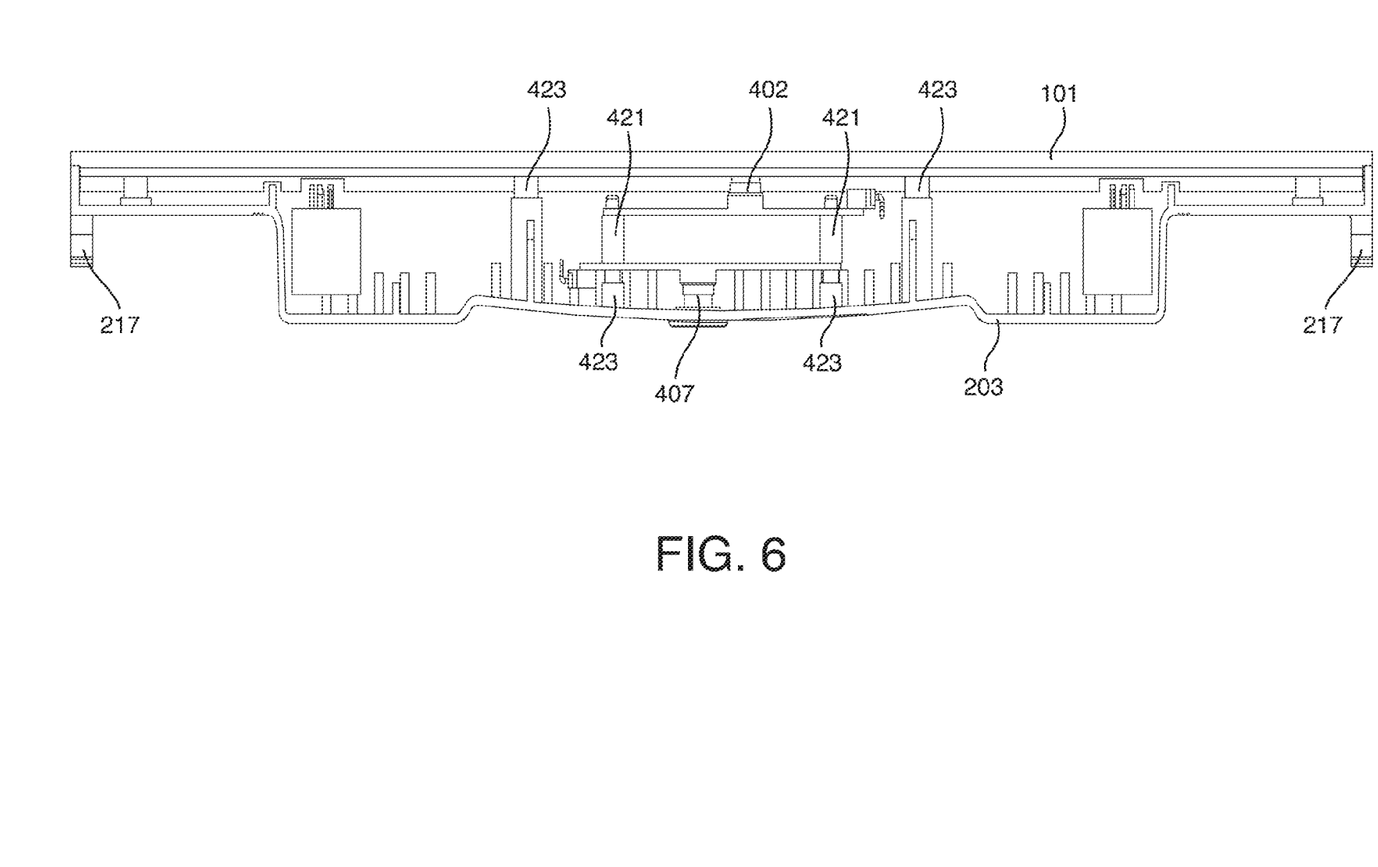
FIG. 6 illustrates a top cross-sectional view of an exemplary display unit provided herein.

FIG. 6 illustrates a top cross-sectional view (e.g., at a longitudinal axis at or about 109 or between 109 and the bottom surface 208 of the display unit 100, as illustrated in FIG. 1 and FIG. 2) of an exemplary display unit 100 provided herein. As illustrated, in some instances, a display unit 100 provided herein comprises (and/or a housing thereof receives) a first (e.g., forward facing) camera body 402 and a second (e.g., rear facing) camera body 407. Further, as illustrated, in some instances, a display unit 100 provided herein comprises (and/or a housing thereof receives) one or more spacer 421 to secure and/or fasten the internal or received components thereof (e.g., between the camera bodies in order to secure and/or fasten the camera bodies 402, 407). Similarly, as illustrated, in some instances, a display unit 100 provided herein comprises (and/or a housing thereof receives) one or more boss structure 423 to secure and/or fasten the internal or received components thereof (e.g., between a camera body and a housing component 203 and/or screen body 101).

In certain embodiments, components provided herein are manufactured from and/or comprise any suitable materials. For example, in certain embodiments, housing components provided herein comprise any suitable materials, such as metal materials (e.g., aluminum or stainless steel), and/or plastic materials (e.g., polystyrene, polyethylene, polypropylene, polyacrylates (e.g., polyacrylonitrile, polymethacrylates (e.g., polybutylmethacrylate, polymethacrylate), polyalkylacrylates (e.g., polymethylacrylate, polyethylacrylate), polyalkylalkacrylate (e.g., polymethylmethacrylate, etc), polyacrylonitrile butadiene polystyrene (ABS), or the like).

Although the system(s) and/or method(s) of this disclosure have been described in detail for the purpose of illustration based on what is currently considered to be the most practical and preferred implementations, it is to be understood that such detail is solely for that purpose and that the disclosure is not limited to the disclosed implementations, but, on the contrary, is intended to cover modifications and equivalent arrangements that are within the spirit and scope of the appended claims. For example, it is to be understood that the present disclosure contemplates that, to the extent possible, one or more features of any implementation can be combined with one or more features of any other implementation.

What is claimed is:

1. A retail display system-comprising:
a first display unit including:
a screen body comprising a first surface and a second surface, the first surface displaying a first array of viewable pixels;
a first camera comprising a first camera lens and a first camera body;
a second camera comprising a second camera lens and a second camera body;
a housing body comprising a rear housing surface, a first lateral housing end, a second lateral housing end, an upper housing end, and a lower housing end;
the housing body including a forward housing body and a rear housing body, the rear housing body defining at least one front housing opening for receiving the forward housing body and the screen body and being affixed to the second surface of the screen body, the first array of viewable pixels being exposed external to the housing body by the at least one front housing opening, the forward housing body being configured in proximity to the lower housing end and the screen body being configured in proximity to the upper housing end;
the housing body receiving the first camera body, the first camera lens being exposed externally to the housing body by an additional front housing opening defined by the forward housing body;
the housing body receiving the second camera body, the second camera lens being exposed externally to the housing body by a first rear housing opening defined by the rear housing body;
the rear housing body defining at least one guide post extending from the first lateral housing end;
a receiving card disposed within the housing body and including a first data connector wherein the rear housing body defines an additional opening to allow external accessibility to the first data connector;
a second display unit including a second array of viewable pixels, the second display unit being joined together with the first display unit and configured to receive the at least one guide post;
wherein the first data connector provides at least one of display data from the second display unit to be displayed by the first array of viewable pixels and display data to the second display unit to be displayed by the second array of viewable pixels.

2. The retail display system of claim 1, wherein the housing body comprises:
a first guide post extending from the first lateral housing end, the first guide post being configured between a first longitudinal axis and the upper housing end, the first longitudinal axis bisecting the retail display unit; and
a second guide post extending from the first or second lateral housing end, the second guide post being configured on the first longitudinal axis, or between the first longitudinal axis and the lower housing end.

3. The retail display system of claim 1, the retail display unit further comprising:
a mounting fastener comprising a plate configured to have a first side mount surface, a second side mount surface, and a lower mount surface, the first side mount surface being secured to the rear housing surface, and the distance between the first side mount surface and the second side mount surface being larger proximal to the lower mount surface than distal to the lower mount surface.

4. The retail display system of claim 3, wherein proximal to the lower surface, the second side surface curves away from the first side surface, and distal to the lower surface, the second side surface curves toward the first side surface.

5. The retail display system of claim 3, further comprising:
a magnet mounted on the rear surface, the magnet being configured between the lower mount surface of the mounting fastener and the upper housing end.

6. The retail display system of claim 1, further comprising:
a first mounting fastener comprising a plate configured to have a first side mount surface, a second side mount surface, and a first lower mount surface, the first surface being secured to the rear housing surface, and the distance between the first surface and the second being shorter proximal to the lower mount surface than distal to the lower surface, the first mounting fastener being configured (i) between a first longitudinal axis and the upper housing end, the first longitudinal axis bisecting the retail display unit, and (ii) between a first long transversal axis and the first lateral housing end, the first long transversal axis bisecting the display unit; and
a second mounting fastener comprising a plate configured to have a third side mount surface, a fourth side mount surface, and
a second lower mount surface, the third side mount surface being secured to the rear housing surface, and the distance between the third side mount surface and the fourth mount side surface being shorter proximal to the lower mount surface than distal to the lower mount surface, the second mounting fastener being configured (i) between the first longitudinal axis and the upper housing end, and (ii) between a first long transversal axis and the second lateral housing end, the first long transversal axis bisecting the retail display unit.

7. The retail display system of claim 6, further comprising:
a first magnet mounted on the rear surface, the first magnet being configured, long transversely, between the first lower mount surface of the first mounting fastener and the upper housing end, the first magnet being mounted between the first long transversal axis and the first lateral housing end; and
a second magnet mounted on the rear surface, the second magnet being configured, long transversely, between the second lower mount surface of the second mounting fastener and the upper housing end, the second magnet being mounted between the first long transversal axis and the second lateral housing end.

8. The retail display system of claim 1, further comprising a fastener secured to the rear surface of the retail display unit, the fastener configured to attach to a panel edge.

9. The retail display system of claim 1, further comprising
a first power connector configured to provide or to be connected to provide direct current to and/or from the retail display unit;
a second direct current power connector configured to provide or to be connected to provide direct current to and/or from the retail display unit;
a first data connector configured to receive or to be connected to at least one of receive display content and convey, or be connected to convey, display content from the retail display unit;
a second data connector configured to receive or to be connected to at least one of receive display content and convey, or be connected to convey, display content from the retail display unit;
a third data connector configured to convey or to be connected to convey data from the first camera;
a fourth data connector configured to convey or to be connected to convey data from the second camera;
a raised rear housing component of the rear surface of the housing body, the raised rear housing component including a raised component rear surface, a first raised component lateral end surface, and a second raised component lateral end surface;
the first power connector being configured such that it is externally accessible by a second rear housing opening defined by the first raised component lateral end surface of the raised rear housing component;
the second power connector being configured such that it is externally accessible by a third rear housing opening defined by the second raised component lateral end surface of the raised rear housing component;
the first data connector being configured such that it is externally accessible by a fourth rear housing opening defined by the first raised component lateral end surface of the raised rear housing component; and
the second data connector being configured such that it is externally accessible by a fifth rear housing opening defined by the second raised component lateral end surface of the raised rear housing component.

10. The retail display system of claim 9, wherein
the first rear housing opening is defined by the raised component rear surface of the raised rear housing component;
the third data connector is configured such that it is externally accessible by a sixth rear housing opening defined by the raised component rear surface of the raised rear housing component; and
the fourth data connector is configured such that it is externally accessible by a seventh rear housing opening defined by the raised component rear surface of the raised rear housing component.

11. The retail display system of claim 1, wherein the guide post is detachable.

12. The retail display system of claim 11, wherein the length of the retail display unit is at least 25 cm and the height of the retail display unit is less than 20 cm.

13. The retail display system of claim 12, wherein the depth of the display unit is about 2.5 cm or less.

14. The retail display system of claim 1, wherein the aspect ratio of the retail display unit is about 2 or more.

15. The retail display system of claim 1, wherein the array has a pixel pitch of about 2.5 mm or less.

16. The retail display system of claim 1 wherein the first display unit and the second display unit are joined together so that the first array of viewable pixels and the second array of viewable pixels form a continuous display configuration.

17. The retail display system of claim 1 wherein the first display unit includes a second data connector extending from the second lateral housing end and wherein the first data connector extends from the first lateral housing end.

18. A retail display system comprising:
a first display unit including:
a screen body including a first surface and a second surface, the first surface displaying a first array of viewable pixels;
a first camera including a first camera lens and a first camera body;
a second camera including a second camera lens and a second camera body;

a housing body including a rear housing surface, a first lateral housing end, a second lateral housing end, an upper housing end, and a lower housing end;

the housing body including a forward housing body and a rear housing body, the rear housing body defining at least one front housing opening for receiving the forward housing body and the screen body and being affixed to the second surface of the screen body, the first array of viewable pixels being exposed external to the housing body by the at least one front housing opening, the forward housing body being configured in proximity to the lower housing end and the screen body being configured in proximity to the upper housing end;

the housing body receiving the first camera body, the first camera lens being exposed externally to the housing body by an additional front housing opening defined by the forward housing body;

the housing body receiving the second camera body, the second camera lens being exposed externally to the housing body by the first rear housing opening defined by the rear housing body;

a first data connector wherein the rear housing body defines an additional opening to allow external accessibility to the first data connector; and a second display unit configured with a second array of viewable pixels, the second display unit being configured being joined together with the first display unit;

wherein the first data connector provides at least one of display data from the second display unit to be displayed by the first array of viewable pixels and display data to the second display unit to be displayed by the second array of viewable pixels.

19. The retail display system of claim 1 wherein the first data connector is different from the at least one guide post.

20. The retail display system of claim 1 wherein the first display unit includes a transparent cap covering the additional front housing opening.

21. The retail display system of claim 18 wherein the first data connector is part of a receiving card.

22. The retail display system of claim 18, further including:
a fastener secured to the rear surface of the retail display unit, the fastener configured to attach to a panel edge;
a magnet mounted on the rear surface, the center of the magnet being configured, long transversely, between a lower mount surface of the fastener and the upper housing end;
a first power connector configured to provide or to be connected to provide direct current to and/or from the retail display unit;
a second direct current power connector configured to provide or to be connected to provide direct current to and/or from the retail display unit;
a first data connector configured to receive or to be connected to receive display content, and/or configured to convey or to be connected to convey display content from the retail display unit;
a second data connector configured to receive or to be connected to receive display content, and/or configured to convey or to be connected to convey display content from the LED retail display unit;
a third data connector configured to convey or to be connected to convey data from the first camera; and
a fourth data connector configured to convey or to be connected to convey data from the second camera;

wherein:
the housing body includes a first guide post extending from the first lateral housing end, the first guide post being configured between a first longitudinal axis and the upper housing end, the first longitudinal axis bisecting the retail display unit;
the housing body includes a second guide post extending from the first or second lateral housing end, the second guide post being configured on the first longitudinal axis, or between the first longitudinal axis and the lower housing end.

23. A retail merchandising display system comprising:
a first retail display unit comprising:
a first screen body comprising a first surface and a second surface, the first surface displaying a first array of viewable pixels;
a first camera comprising a first camera lens and a first camera body;
a second camera comprising a second camera lens and a second camera body;
a first housing body comprising a first rear housing surface, a first lateral housing end, a second lateral housing end, a first upper housing end, and a first lower housing end;
the first housing body including a forward housing body and a rear housing body, the rear housing body defining at least one front housing opening for receiving the forward housing body and the first screen body and being affixed to the second surface of the first screen body, the first array of viewable pixels being exposed external to the first housing body by the at least one first front housing opening, the forward housing body being configured in proximity to the lower housing end and the screen body being configured in proximity to the upper housing end;
the first housing body receiving the first camera body, the first camera lens being exposed externally to the first housing body by an additional first front housing opening defined by the forward housing body;
the first housing body receiving the second camera body, the second camera lens being exposed externally to the first housing body by a first rear housing opening defined by the rear housing body;
the rear housing body defining a first guide post extending from the first lateral housing end;
a first data connector wherein the rear housing body defines an additional opening to allow external accessibility to the first data connector; and
a second retail display unit joined together with the first retail display unit, the second retail display unit comprising:
a second screen body comprising a third surface and a fourth surface, the third surface displaying a second array of viewable pixels;
a second housing body comprising a second rear housing surface, a third lateral housing end, a fourth lateral housing end, a second upper housing end, and a second lower housing end, the second housing body defining at least one second front housing opening, and a second rear housing opening;
the second housing body receiving the second screen body and being affixed to the fourth surface of the screen body, the second array of viewable pixels being exposed external to the second housing body by the at least one second front housing opening;

the second housing body comprising a second guide post extending from the third lateral housing end wherein the second housing body is configured to receive the first guide post wherein the first data connector provides at least one of display data from the second retail display unit to be displayed by the first array of viewable pixels and display data to the second retail display unit to be displayed by the second array of viewable pixels.

24. The retail merchandising display system of claim 23, further comprising a retail shelving unit comprising at least one shelf comprising a top surface, a front edge, and a front panel, the front panel comprising a metal and being arranged at the front edge of the shelf;

a first fastener secured to the first rear housing surface of the first retail display unit, the first fastener attached to the front panel;

a second fastener secured to the second rear housing surface of the second retail display unit, the second fastener attached to the front panel.

* * * * *